(12) United States Patent
Kijima et al.

(10) Patent No.: US 10,707,832 B2
(45) Date of Patent: Jul. 7, 2020

(54) VIBRATING DEVICE

(71) Applicant: TDK CORPORATION, Tokyo (JP)

(72) Inventors: Kaoru Kijima, Tokyo (JP); Kazushi Tachimoto, Tokyo (JP); Tatsuya Taki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 488 days.

(21) Appl. No.: 15/685,301

(22) Filed: Aug. 24, 2017

(65) Prior Publication Data

US 2018/0062616 A1 Mar. 1, 2018

(30) Foreign Application Priority Data

Sep. 1, 2016 (JP) .................................. 2016-170866
Feb. 13, 2017 (JP) .................................. 2017-024423

(51) Int. Cl.
*H03H 9/205* (2006.01)
*H03H 9/17* (2006.01)
*H01L 41/047* (2006.01)
*H01L 41/09* (2006.01)
*H03H 9/05* (2006.01)
*H03H 9/13* (2006.01)

(52) U.S. Cl.
CPC ......... *H03H 9/178* (2013.01); *H01L 41/0474* (2013.01); *H01L 41/0986* (2013.01); *H03H 9/0595* (2013.01); *H03H 9/131* (2013.01); *H03H 9/205* (2013.01)

(58) Field of Classification Search
CPC ............................ H03H 9/178; H01L 41/0474
See application file for complete search history.

(56) References Cited

U.S. PATENT DOCUMENTS 5,245,734 A * 9/1993 Issartel ............... H01L 41/0471
29/25.35
7,056,443 B2 * 6/2006 Sasaki ..................... B32B 18/00
216/18

(Continued)

FOREIGN PATENT DOCUMENTS

CN 104053511 A 9/2014
CN 207338430 U 5/2018

(Continued)

*Primary Examiner* — Thomas M Dougherty
*Assistant Examiner* — Karen B Addison
(74) *Attorney, Agent, or Firm* — Oliff PLC

(57) ABSTRACT

A piezoelectric element body has a first principal surface and a second principal surface. A pair of first electrodes is disposed on the first principal surface. The vibrating body includes a metal plate, an insulating layer, and a pair of second electrodes. The metal plate has a third principal surface and a fourth principal surface. The insulating layer is disposed on the third principal surface. The pair of second electrodes is disposed on the insulating layer. The piezoelectric element and the vibrating body are disposed in such a manner that the first principal surface and the third principal surface oppose each other via the insulating layer. The pair of second electrodes physically contacts the respective first electrodes. The second electrodes are exposed from the piezoelectric element and are separated from all of edges of the insulating layer, when viewed from a direction orthogonal to the third principal surface.

6 Claims, 11 Drawing Sheets

(56) References Cited

U.S. PATENT DOCUMENTS

| | | | |
|---|---|---|---|
| 7,253,553 B2* | 8/2007 | Sasaki | H01L 41/083 310/364 |
| 7,352,115 B2* | 4/2008 | Sasaki | B41J 2/14274 310/363 |
| 2003/0222240 A1* | 12/2003 | Sasaki | B32B 18/00 252/62 |
| 2018/0062616 A1 | 3/2018 | Kijima et al. | |

FOREIGN PATENT DOCUMENTS

| | | |
|---|---|---|
| JP | H04-70100 A | 3/1992 |
| JP | 2001-332041 A | 11/2001 |
| JP | 2004-002069 A | 1/2004 |
| JP | 2006-141082 A | 6/2006 |
| JP | 2009-065760 A | 3/2009 |
| JP | 2010-258056 A | 11/2010 |
| WO | 2012/060235 A1 | 5/2012 |

\* cited by examiner

Fig.1
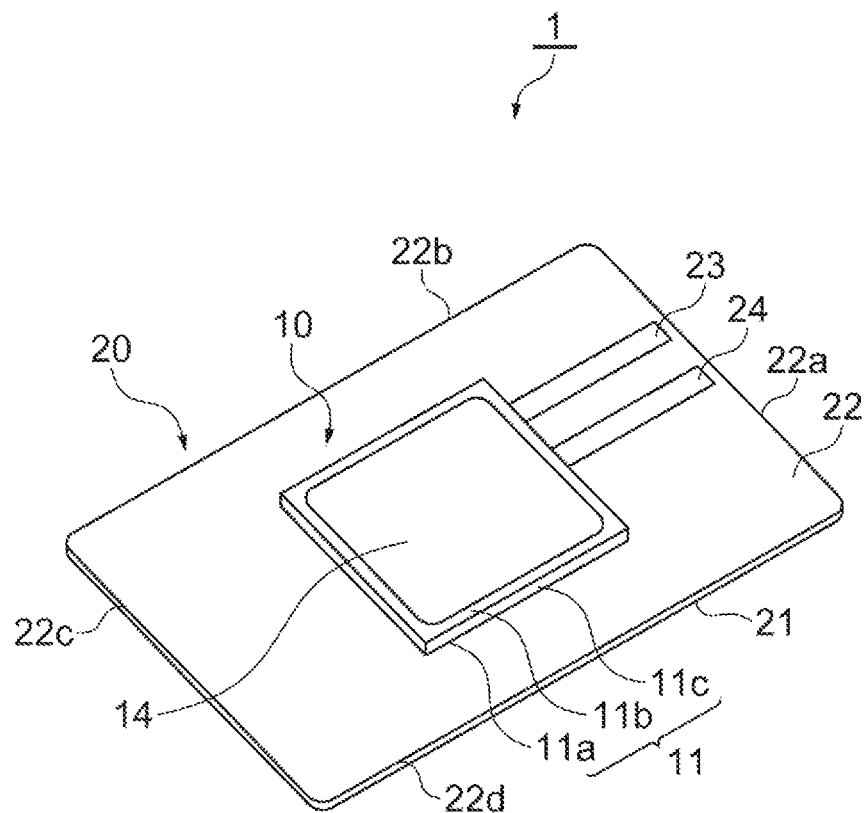
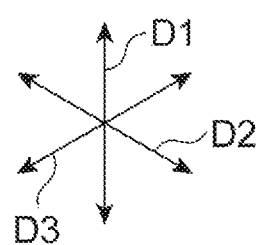

Fig.2
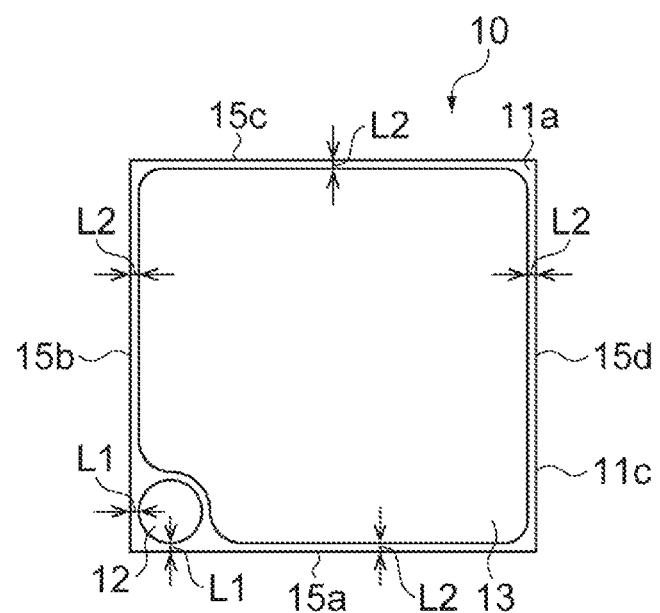
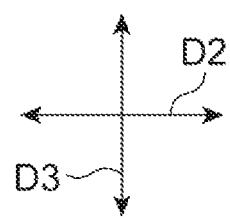

Fig.3
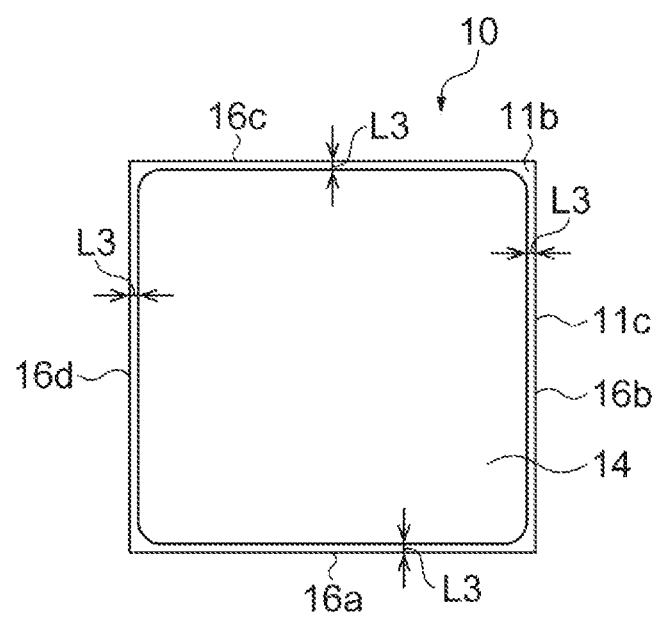
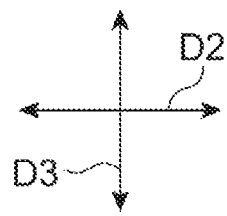

VIBRATING DEVICE

BACKGROUND OF THE INVENTION

1. Field of the Invention

The present invention relates to a vibrating device.

2. Description of Related Art

Japanese Unexamined Patent Publication No. 1104-70100 discloses a vibrating device including a piezoelectric element and a vibrating body. The piezoelectric element includes a piezoelectric element body and a pair of first electrodes. The piezoelectric element body has a first principal surface and a second principal surface opposing each other. The pair of first electrodes is disposed on the first principal surface. The vibrating body has a third principal surface and a fourth principal surface opposing each other, and includes a pair of second electrodes. The pair of second electrodes is electrically connected to the respective first electrodes. The piezoelectric element and the vibrating body are disposed in such a manner that the first principal surface and the third principal surface oppose each other. The second electrodes are exposed from the piezoelectric element when viewed from a direction orthogonal to the third principal surface. In the vibrating device disclosed in the above patent publication, the vibrating body includes a glass plate, and the pair of second electrodes is disposed on the glass plate.

SUMMARY OF THE INVENTION

In the vibrating device disclosed in the above patent publication, the vibrating body includes the glass plate. As a result, a Q value and strength of the vibrating body are relatively low, and improvement on a displacement amount tends not to be expected in the vibrating device.

The present invention is directed to providing a vibrating device in which the displacement amount is improved.

A vibrating device according to one aspect of the present invention includes a piezoelectric element and a vibrating body. The piezoelectric element includes a piezoelectric element body and a pair of first electrodes. The piezoelectric element body has a first principal surface and a second principal surface opposing each other. The pair of first electrodes is disposed on the first principal surface. The vibrating body includes a metal plate, an insulating layer, and a pair of second electrodes. The metal plate has a third principal surface and a fourth principal surface opposing each other. The insulating layer is disposed on the third principal surface. The pair of second electrodes is disposed on the insulating layer. The piezoelectric element and the vibrating body are disposed in such a manner that the first principal surface and the third principal surface oppose each other via the insulating layer. The pair of second electrodes physically contacts the respective first electrodes. The pair of second electrodes is exposed from the piezoelectric element and separated from all of edges of the insulating layer, when viewed from a direction orthogonal to the third principal surface.

According to the one aspect, the vibrating body includes a metal plate. The metal plate has a Q value and strength higher than a glass plate does. As a result, a displacement amount of the vibrating device is improved.

According to the one aspect, since the second electrodes are disposed on the insulating layer, the second electrodes are electrically insulated from the metal plate. Since the second electrodes are separated from all of the edges of the insulating layer when viewed from the direction orthogonal to the third principal surface, the second electrodes are surely electrically insulated from the metal plate. Therefore, even when the vibrating body includes the metal plate instead of the glass plate, electrical insulation is secured between the metal plate and the second electrodes.

An electronic component according the one aspect may further include an adhesive member joining the piezoelectric element and the vibrating body. The pair of first electrodes may have a plurality of projections that physically contacts the respective second electrodes. In which case, the adhesive member may be provided between the plurality of projections, and may join the first electrode and second electrode corresponding to each other. In this embodiment, the first electrode and the second electrode are joined by the adhesive member provided between the plurality of projections. Therefore, joining strength between the vibrating body and the piezoelectric element is secured.

In the vibrating device according to the one aspect, the pair of first electrodes may be separated from all of the edges of the first principal surface when viewed from a direction orthogonal to the first principal surface. In which case, the first electrodes are prevented from contacting a conductor included in a device other than the vibrating device.

In the vibrating device according to the one aspect, the piezoelectric element may further include a third electrode disposed on the second principal surface. The third electrode may be separated from all of edges of the second principal surface when viewed from a direction orthogonal to the second principal surface. In which case, the third electrode is prevented from contacting a conductor included in a device other than the vibrating device.

In the vibrating device according to the one aspect, the piezoelectric element body may further include a side surface coupling the first principal surface to the second principal surface. The entire second principal surface and the entire side surface may also be exposed. In which case, in the piezoelectric element body, an electrode is not exposed on a surface other than the first principal surface opposing the vibrating body (third principal surface). Therefore, the electrodes included in the piezoelectric element are prevented from contacting a conductor included in a device other than the vibrating device.

In the vibrating device according to the one aspect, the piezoelectric element may further include a plurality of internal electrodes and a conductor that are disposed inside the piezoelectric element body. The plurality of internal electrodes may oppose each other. The conductor may electrically connect the internal electrode to the first electrode corresponding to each other. In which case, the conductor that electrically connects the internal electrode to the first electrode corresponding to each other is not needed to be disposed on the surface of the piezoelectric element. Therefore, the electrode (conductor) included in the piezoelectric element is prevented from electrically contacting a conductor included in a device other than the vibrating device.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 1 is a schematic perspective view illustrating a vibrating device according to an embodiment;

FIG. 2 is a plan view of a piezoelectric element;

FIG. 3 is a plan view of the piezoelectric element;

DETAILED DESCRIPTION OF EMBODIMENTS

Figure 4:
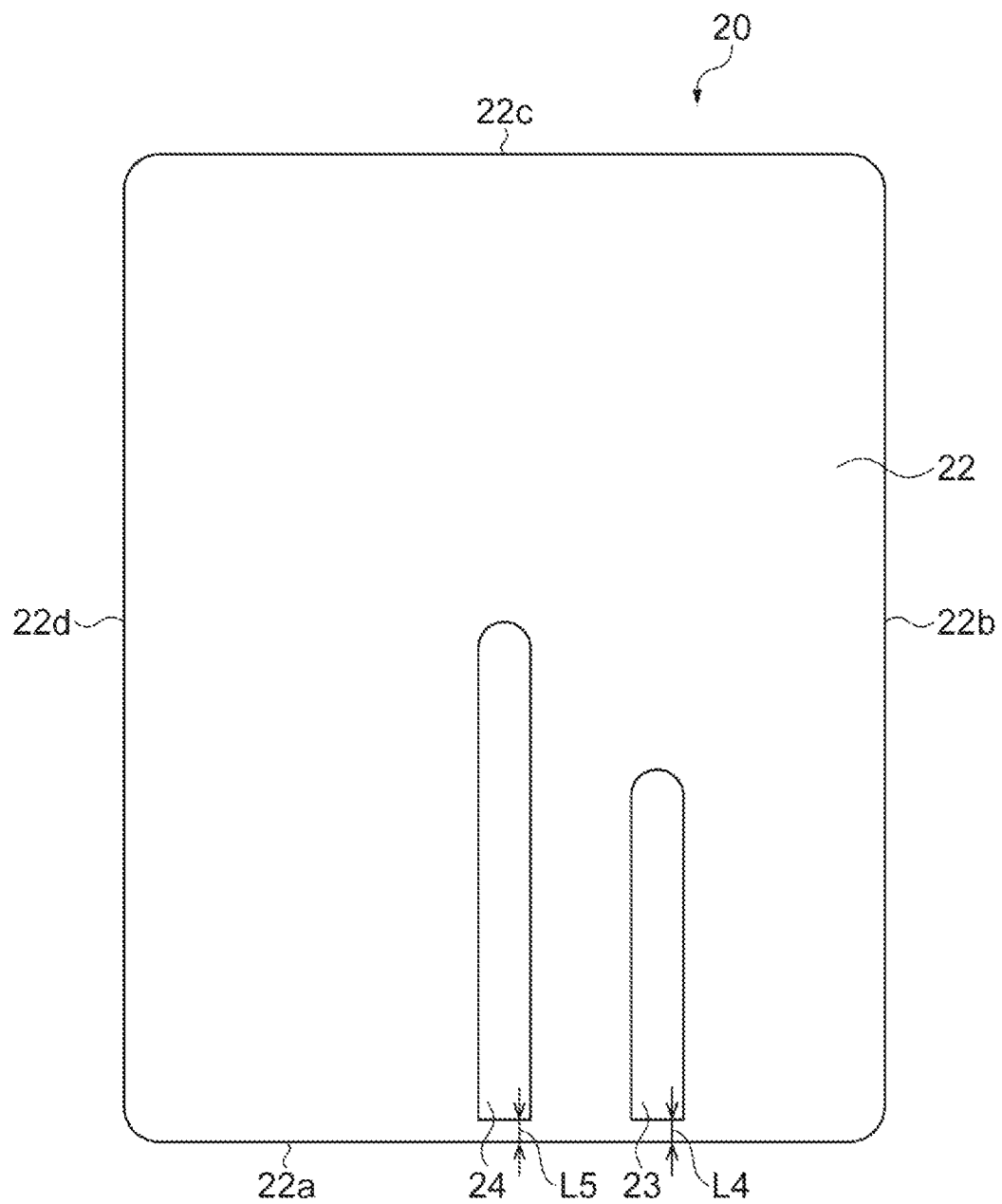
FIG. 4 is a plan view of a vibrating body.

Embodiments of the present invention will be hereinafter described in detail with reference to the accompanying drawings. In the description, the same reference numerals are used for the same elements or elements having the same functions, and redundant descriptions thereabout are omitted.

Figure 5:
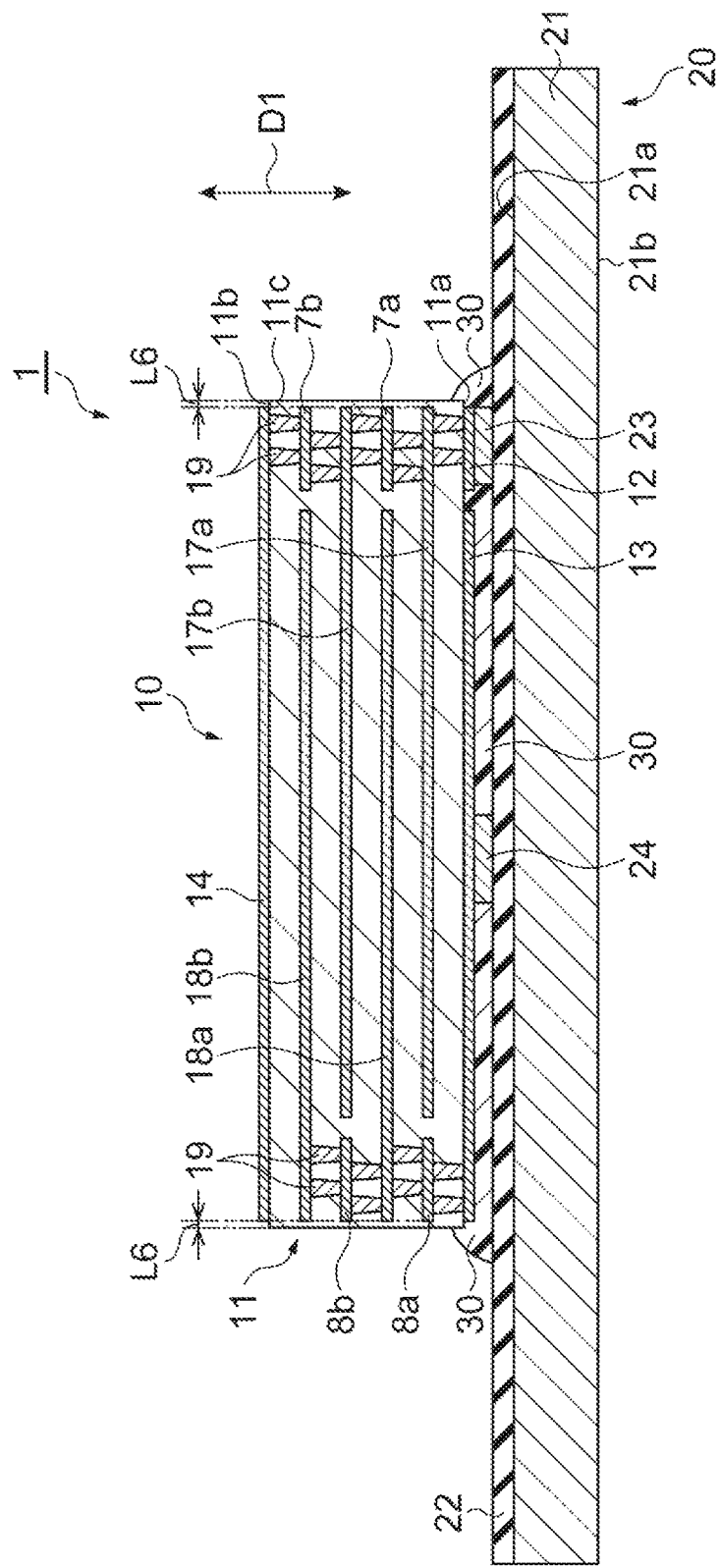
FIG. 5 is a diagram illustrating a cross-sectional configuration of the piezoelectric element.

First, a configuration of a vibrating device according to the present embodiment will be described with reference to FIGS. 1 to 5. FIG. 1 is a schematic perspective view illustrating a vibrating device according to the present embodiment. FIGS. 2 and 3 are plan views of a piezoelectric element. FIG. 4 is a plan view of a vibrating body. FIG. 5 is a diagram illustrating a cross-sectional configuration of the piezoelectric element.

As illustrated in FIG. 1, the vibrating device 1 includes a piezoelectric element 10, a vibrating body 20, and an adhesive member 30. The adhesive member 30 joins the piezoelectric element 10 and the vibrating body 20.

The piezoelectric element 10 includes a piezoelectric element body 11, a pair of first electrodes 12, 13, a plurality of internal electrodes 17a, 17b, 18a, 18b, a plurality of pad conductors 7a, 7b, 8a, 8b, a third electrode 14, and a via conductor 19. The piezoelectric element body 11 includes a plurality of piezoelectric layers. The piezoelectric element 10 has a laminating structure. The plurality of internal electrodes 17a, 17b, 18a, 18b and the plurality of piezoelectric layers are alternately disposed.

The piezoelectric element body 11 has a rectangular parallelepiped shape. The piezoelectric element body 11 has a first principal surface 11a and a second principal surface 11b opposing each other, and four side surfaces 11c. The first principal surface 11a has a rectangular shape and includes four edges 15a, 15b, 15c, 15d. The second principal surface 11b has a rectangular shape and includes four edges 16a, 16b, 16c, 16d. Each of the side surfaces 11c extends in a direction in which the first principal surface 11a and the second principal surface 11b oppose each other to couple the first principal surface 11a to the second principal surface 11b. The rectangular parallelepiped shape also includes a rectangular parallelepiped shape in which corners and ridges are chamfered, and a rectangular parallelepiped shape in which corners and ridges are rounded. The shape of the piezoelectric element body 11 is not limited to a rectangular parallelepiped shape and may also be a disk-like shape, for example.

A first direction D1 in which the first principal surface 11a and the second principal surface 11b oppose each other is a thickness direction of the piezoelectric element body 11. A second direction D2 in which the pair of side surfaces 11c oppose each other is a longitudinal direction of the piezoelectric element body 11. A third direction D3 in which the other pair of side surfaces 11c oppose each other is a width direction of the piezoelectric element body 11. The piezoelectric element body 11 has a length in the second direction D2 of, for example, 50 mm. The piezoelectric element body 11 has a length in the third direction D3 of, for example, 50 mm. The piezoelectric element body 11 has a length in the first direction D (thickness of the piezoelectric element body 11) of, for example, 0.1 mm. In the present embodiment, the first direction D1, second direction D2, and third direction D3 are orthogonal to each other.

The piezoelectric element body 11 is configured by laminating a plurality of piezoelectric layers in the first direction D1. In the present embodiment, the direction in which the plurality of piezoelectric layers is laminated coincides with the direction (first direction D1) in which the first principal surface 11a and the second principal surface 11b oppose each other. The piezoelectric element body 11 is made of a piezoelectric ceramic material. The piezoelectric ceramic material includes, for example, PZT [Pb(Zr, Ti) O$_3$], PT (PbTiO$_3$), PLZT [(Pb, La) (Zr, Ti) O$_3$], or barium titanate (BaTiO$_3$). Each of the piezoelectric layers is formed of, for example, a sintered body of a ceramic green sheet including the above-described piezoelectric ceramic material. In the actual piezoelectric element body 11, the respective piezoelectric layers are integrated to such an extent that a boundary between the respective piezoelectric layers cannot be recognized.

As illustrated in FIGS. 2 and 5, the pair of first electrodes 12, 13 is disposed on the first principal surface 11a of the piezoelectric element body 11. As illustrated in FIGS. 1, 3, and 5, the third electrode 14 is disposed on the second principal surface 11b of the piezoelectric element body 11. As illustrated in FIG. 5, the plurality of internal electrodes 17a, 18a, 17b, 18b is disposed inside the piezoelectric element body 11. The internal electrode 17a and the internal electrode 18a oppose each other via the piezoelectric layer. The internal electrode 18a and the internal electrode 17b oppose each other via the piezoelectric layer. The internal electrode 17b and the internal electrode 18b oppose each other via the piezoelectric layer. As illustrated in FIGS. 1 and 5, no electrode is disposed on the side surfaces 11c of the piezoelectric element body 11. Therefore, an entire portion of each of the side surfaces 11c is exposed without being covered with an electrode.

The first electrodes 12, 13, internal electrodes 17a, 17b, 18a, 18b, pad conductors 7a, 7b, 8a, 8b, and third electrode 14 are conductors and made of a conductive material. The conductive material includes, for example, Ag, Pd, Cu, or the like. Each of the conductors is formed as a sintered body of conductive paste including the conductive material.

As illustrated in FIG. 2, the pair of first electrodes 12, 13 is separated from all of the edges 15a, 15b, 15c, 15d of the first principal surface 11a when viewed from a direction orthogonal to the first principal surface 11a. The pair of first electrodes 12, 13 is separated from the side surfaces 11c when viewed from the direction orthogonal to the first principal surface 11a. In the present embodiment, a separation distance L1 between an edge of the first electrode 12 and the edges 15a, 15b is 20 μm or more when viewed from the direction orthogonal to the first principal surface 11a. In the present embodiment, a separation distance L2 between the edge of the first electrode 13 and the edges 15a, 15b, 15c, 15d is 20 μm or more when viewed from the direction orthogonal to the first principal surface 11a. The direction orthogonal to the first principal surface 11a coincides with the first direction D1.

The first electrode 12 has a circular shape when viewed from the direction orthogonal to the first principal surface 11a. The first electrode 12 is disposed closer to the corner defined by a pair of adjacent edges 15a, 15b than the first electrode 13 is. The first electrode 12 is not necessarily disposed adjacent to the corner of the first principal surface 11a. For example, the first electrode 12 may also be disposed adjacent to one of the four edges 15a, 15b, 15c, 15d.

The first electrode 13 is separated from the first electrode 12 on the first principal surface 11a. The first electrode 13 has a polygonal shape when viewed from the direction orthogonal to the first principal surface 11a. The polygonal shape includes, for example, a shape in which corners are rounded. In the present embodiment, the first electrode 13 has a substantially rectangular shape. The first electrode 13 has a shape in which a region where the first electrode 12 is disposed is excluded from a rectangular shape. The first principal surface 11a includes edge regions extending along all of the edges 15a, 15b, 15c, 15d and having a predetermined width. The predetermined width is the separation distance L2. The first electrode 13 is located in a region which is included in the first principal surface 11a and excludes the region where the first electrode 12 is arranged and the above-described edge region.

The internal electrodes 17a, 17b are electrically connected to each other by the pad conductors 7a, 7b and the via conductor 19. The internal electrodes 18a, 18b are electrically connected to each other by the pad conductors 8a, 8b and the via conductor 19.

The internal electrodes 17a, 17b and the pad conductors 7a, 7b are disposed to oppose each other via the piezoelectric layers. The internal electrodes 17a, 17b and the pad conductors 7a, 7b are disposed in the order of the internal electrode 17a, the pad conductor 7a, the internal electrode 17b, and the pad conductor 7b in a direction from the first principal surface 11a to the second principal surface 11b. The internal electrodes 18a, 18b and the pad conductors 8a, 8b are disposed to oppose each other via the piezoelectric layers. The internal electrodes 18a, 18b and the pad conductors 8a, 8b are disposed in the order of the pad conductor 8a, the internal electrode 18a, the pad conductor 8b, and the internal electrode 18b in a direction from first principal surface 11a to the second principal surface 11b. The internal electrode 17a and the pad conductor 8a are located in the same layer and separated from each other. The pad conductor 7a and the internal electrode 18a are located in the same layer and separated from each other. The internal electrode 17b and the pad conductor 8b are located in the same layer and separated from each other. The pad conductor 7b and the internal electrode 18b are located in the same layer and separated from each other.

The internal electrodes 17a, 17b, 18a, 18b and the pad conductors 7a, 7b, 8a, 8b are separated from the side surfaces 11c. In the present embodiment, a separation distance L6 between the side surfaces 11c and respective edges of the internal electrodes 17a, 17b, 18a, 18b and pad conductors 7a, 7b, 8a, 8b is 10 μm or more when viewed from the direction orthogonal to the first principal surface 11a.

The pad conductors 7a, 7b, 8a, 8b each have a circular shape when viewed from the direction orthogonal to the first principal surface 11a. For example, the pad conductors 7a, 7b, 8a, 8b each have the shape substantially same as the first electrode 12.

The pad conductors 7a and 7b are disposed adjacent to a corner defined by a pair of adjacent side surfaces 11c when viewed from the direction orthogonal to the first principal surface 11a. The pad conductors 7a and 7b are disposed to overlap with the first electrode 12 when viewed from the direction orthogonal to the first principal surface 11a. The pad conductors 8a, 8b are disposed adjacent to a corner different from the corner where the pad conductors 7a, 7b are located when viewed from the direction orthogonal to the first principal surface 11a. The pad conductors 7a, 7b, 8a, 8b are not constantly needed to be disposed adjacent to a corner defined by a pair of adjacent side surfaces 11c. For example, the pad conductors 7a, 7b, 8a, 8b may also be disposed adjacent to one side surface of the four side surfaces 11c.

The internal electrodes 17a, 17b, 18a, 18b each have a polygonal shape when viewed from the direction orthogonal to the first principal surface 11a. The polygonal shape includes, for example, a shape in which corners are rounded. In the present embodiment, the internal electrodes 17a, 17b, 18a, 18b each have a substantially rectangular shape. For example, the internal electrodes 17a, 17b, 18a, 18b each have a shape substantially same as the first electrode 13.

As illustrated in FIG. 3, the third electrode 14 is separated from all of the edges 16a, 16b, 16c, 16d when viewed from a direction orthogonal to the second principal surface 11b. The third electrode 14 is separated from the side surfaces 11c when viewed from the direction orthogonal to the second principal surface 11b. In the present embodiment, a separation distance L3 between an edge of the third electrode 14 and each of the edges 16a, 16b, 16c, 16d is 20 μm or more when viewed from the direction orthogonal to the second principal surface 11b. The third electrode 14 has a rectangular shape when viewed from the direction orthogonal to the first principal surface 11a. The rectangular shape includes, for example, a shape in which corners are rounded. The direction orthogonal to the second principal surface 11b coincides with the first direction D1.

The first electrode 13, internal electrodes 17a, 17b, 18a, 18b, and third electrode 14 include a mutually overlapping region when viewed from the direction orthogonal to the first principal surface.

The via conductor 19 is disposed inside the piezoelectric element body 11. The via conductor 19 is located adjacent to a side surface 11c when viewed from the direction orthogonal to the first principal surface 11a. The via conductor 19 physically electrically connects adjacent conductors (internal electrodes 17a, 17b, 18a, 18b, pad conductors 7a, 7b, 8a, 8b, and first electrodes 12, 13) in the direction in which the first principal surface 11a and the second principal surface 11b oppose each other. The via conductor 19 penetrates a piezoelectric layer located between the conductors adjacent to each other in the direction in which the first principal surface 11a and the second principal surface 11b oppose each other. The first electrode 12, internal electrode 17a, pad conductor 7a, internal electrode 17b, pad conductor 7b, and third electrode 14 are electrically connected via the via conductor 19. The first electrode 13, pad conductor 8a, internal electrode 18a, pad conductor 8b, and internal electrode 18b are electrically connected via the via conductor 19.

In the present embodiment, the conductors adjacent to each other in the direction in which the first principal surface 11a and the second principal surface 11b oppose each other are connected by a pair of via conductors 19. The conductors adjacent to each other in the direction in which the first principal surface 11a and the second principal surface 11b oppose each other may be connected by one via conductor 19 or may also be connected by three or more via conductors 19. The via conductors 19 are located in regions overlapping with the corresponding pad conductors 7a, 7b, 8a, 8b when viewed from the direction orthogonal to the first principal surface 11a.

The vibrating body 20 includes a metal plate 21, an insulating layer 22, and a pair of second electrodes 23, 24. The insulating layer 22 is disposed on the metal plate 21. The pair of second electrodes 23, 24 is disposed on the insulating layer 22. The vibrating body 20 is disposed in such a manner that the metal plate 21 and the piezoelectric element body 11 oppose each other via the insulating layer 22. The vibrating body 20 and the piezoelectric element 10 are joined by the adhesive member 30. The vibrating body 20 has a rectangular shape when viewed from the direction orthogonal to the first principal surface 11a. The rectangular shape includes, for example, a shape in which corners are rounded. The shape of the vibrating body 20 is not limited to the rectangular shape.

The metal plate 21 has a rectangular shape when viewed from the direction orthogonal to the first principal surface 11a. The rectangular shape includes, for example, a shape in which corners are rounded. The metal plate 21 includes a third principal surface 21a and a fourth principal surface 21b opposing each other. The third principal surface 21a includes four edges 22a, 22b, 22c, 22d. The metal plate 21 is made of, for example, Ni, stainless steel, brass, invar, or the like. The third principal surface 21a of the metal plate 21 has a dimension of, for example, 80 mm×90 mm. The third principal surface 21a has the area at least larger than the area of the first principal surface 11a of the piezoelectric element 10.

The insulating layer 22 is disposed on the third principal surface 21a. The insulating layer 22 is made of, for example, a polyimide resin or an epoxy resin. The insulating layer 22 has a thickness of, for example, 5 rpm. The insulating layer 22 covers the third principal surface 21a. In the present embodiment, the insulating layer 22 covers the entire third principal surface 21a.

As illustrated in FIG. 4, the pair of second electrodes 23, 24 extends linearly from a center portion of the vibrating body 20 to the edge 22a when viewed from the direction orthogonal to the first principal surface 11a. One end of each of the second electrodes 23, 24 is located at the center portion of the vibrating body 20. The other end of each of the second electrodes 23, 24 is located adjacent to the edge 22a and separated from the edge 22a. The second electrode 23 and the second electrode 24 are separated from each other on the third principal surface 21a. The pair of second electrodes 23, 24 is exposed from the piezoelectric element 10 when viewed from a direction orthogonal to the third principal surface 21a. The pair of second electrodes 23, 24 includes a region exposed from the piezoelectric element 10 when viewed from the direction orthogonal to the third principal surface 21a. The pair of second electrodes 23, 24 is separated not only from the edge 22a but also from the three edges 22b, 22c, 22d when viewed from the direction orthogonal to the third principal surface 21a.

In the present embodiment, a separation distance 1A between the other end of the second electrode 23 and the edge 22a is 5 μm or more when viewed from the direction orthogonal to the third principal surface 21a. A separation distance L5 between the other end of the second electrode 24 and the edge 22a is 5 μm or more when viewed from the direction orthogonal to the third principal surface 21a. The shapes of the second electrodes 23, 24 are not limited to the shapes illustrated. The second electrodes 23, 24 are made of, for example, Au, Sn, Ni, or the like.

Figure 6:
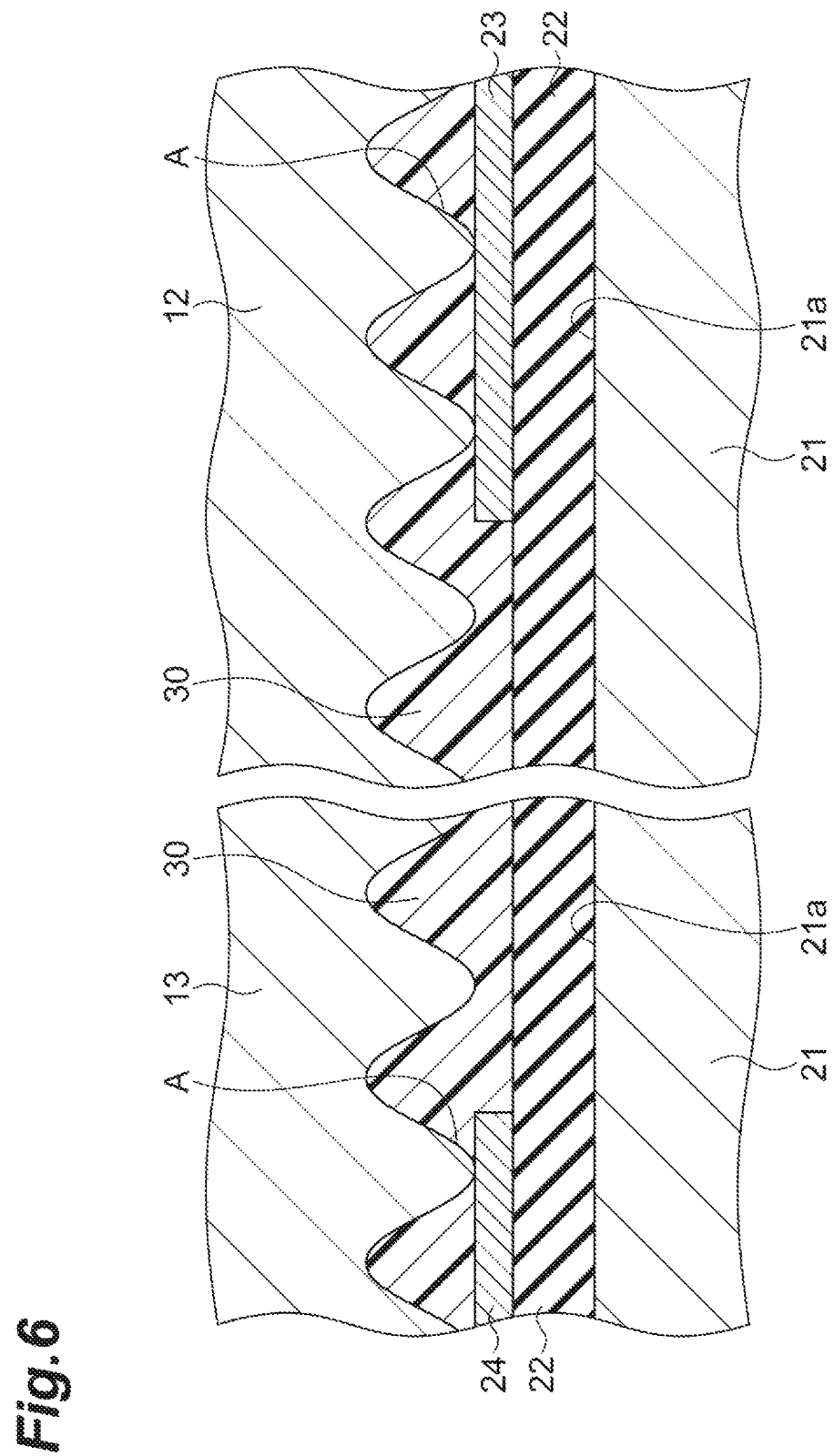
FIG. 6 is a view illustrating a mode in which the piezoelectric element and the vibrating body are joined.

As illustrated in FIG. 6, the pair of second electrodes 23, 24 physically contacts the respective first electrodes 12, 13. The pair of first electrodes 12, 13 includes a plurality of projections A. The plurality of projections A is formed on a surface of each of the first electrodes 12, 13 opposing the vibrating body 20 (the second electrodes 23, 24). The projections A of the first electrode 12 physically contact the second electrode 23. The projections A of the first electrode 13 physically contact the second electrode 24. The surface of the second electrode 23 contacting the first electrode 12 is flatter than the surface of the first electrode 12 opposing the vibrating body 20. The surface of the second electrode 24 contacting the first electrode 13 is also flatter than the surface of the first electrode 13 opposing the vibrating body 20.

As illustrated in FIG. 6, the adhesive member 30 is provided between the plurality of projections A. The adhesive member 30 joins the first electrodes 12, 13 and the second electrodes 23, 24 corresponding to each other. The first electrode 12 and the second electrode 23 are joined by the adhesive member 30, and the first electrode 13 and the second electrode 24 are joined by the adhesive member 30.

In the present embodiment, as illustrated in FIG. 5, the adhesive member 30 joins the insulating layer 22 and the first principal surface 11a, and joins part of the side surfaces 11c and the insulating layer 22.

The adhesive member 30 is made of, for example, an epoxy resin, an acrylic resin, or the like. The adhesive member 30 does not include a conductive filler.

Next, operation and effects of the vibrating device 1 will be described.

As described above, the first electrode 13, internal electrodes 17a, 17b, 18a, 18b, and third electrode 14 include the mutually overlapping region when viewed from the direction orthogonal to the first principal surface. The internal electrodes 17a, 17b and third electrode 14 are electrically connected to the first electrode 12 by the via conductor 19 and the pad conductors 7a, 7b. The internal electrodes 18a, 18b and the third electrode 14 are electrically connected to the first electrode 13 by the via conductor 19 and the pad conductors 8a, 8b.

For example, when voltage having polarities different from each other is applied to the first electrode 12 and the first electrode 13 respectively, electric fields are generated between the first electrode 13 and the internal electrode 17a, between the internal electrode 17a and the internal electrode 18a, between the internal electrode 18a and the internal electrode 17b, between the internal electrode 17b and the internal electrode 18b, and between the internal electrode 18b and the third electrode 14. Therefore, in the piezoelectric element body 11, a region interposed between the first electrode 13 and the internal electrode 17a, a region interposed between the internal electrode 17a and the internal electrode 18a, a region interposed between the internal electrode 18a and the internal electrode 17b, a region interposed between the internal electrode 17b and the internal electrode 18b, and a region interposed between the internal electrode 18b and the third electrode 14 are piezoelectrically activated, thereby causing displacement in the respective regions. For example, in the case where AC voltage is applied to the pair of first electrodes 12, 13, the piezoelectric element 10 repeats expansion and contraction in accordance with a frequency of the applied AC voltage.

The piezoelectric element 10 and the vibrating body 20 are disposed in such a manner that the first principal surface 11a and the third principal surface 21a oppose each other via the insulating layer 22, and are joined to each other by the adhesive member 30. Therefore, the vibrating body 20 vibrates in such a manner as to be integrally deflected with the piezoelectric element 10 in accordance with expansion and contraction of the piezoelectric element 10. The higher a Q value and strength of the vibrating body 20 is, the more a displacement amount of the vibrating body 20 is improved.

In the vibrating device 1, the vibrating body 20 includes the metal plate 21. The vibrating body 20 including the metal plate 21 has a Q value and strength higher than a vibrating body including a glass plate instead of the metal plate 21 does. Therefore, the displacement amount of the vibrating device 1 is improved.

In the vibrating device 1, since the second electrodes 23, 24 are disposed on the insulating layer 22, the second electrodes 23, 24 and the metal plate 21 are electrically insulated. Since the second electrodes 23, 24 are separated from all of the edges 22a, 22b, 22c, 22d of the insulating layer 22 when viewed from the direction orthogonal to the third principal surface 21a, the second electrodes 23, 24 are surely electrically insulated from the metal plate 21. Therefore, even when the vibrating body 20 includes the metal plate 21 instead of the glass plate, an electrically insulated relation is secured between the metal plate 21 and the second electrodes 23, 24.

The first electrodes 12, 13 and the second electrodes 23, 24 are joined by the adhesive member 30 provided between the plurality of projections A. Therefore, joining strength between the vibrating body 20 and the piezoelectric element 10 is secured. In the present embodiment, the insulating layer 22 and the first principal surface 11a are joined by the adhesive member 30, and part of the side surfaces 11c and the insulating layer 22 are joined by the adhesive member 30.

Therefore, the joining strength between the vibrating body 20 and the piezoelectric element 10 is further enhanced.

The first electrodes 12, 13 are separated from all of the edges 15a, 15b, 15c, 15d of the first principal surface 11a when viewed from the direction orthogonal to the first principal surface 11a. Since the first electrodes 12, 13 are not exposed on a surface of the vibrating device 1, the first electrodes 12, 13 are prevented from contacting a conductor included in a device other than the vibrating device 1.

The piezoelectric element 10 includes the third electrode 14 disposed on the second principal surface 11b. The third electrode 14 is separated from all of the edges 16a, 16b, 16c, 16d of the second principal surface 11b when viewed from the direction orthogonal to the second principal surface 11b.

Therefore, the third electrode 14 is prevented from contacting the conductor included in the device other than the vibrating device 1.

The piezoelectric element 10 includes the via conductors 19. The via conductors 19 are disposed inside the piezoelectric element body 11 and electrically connect the first electrodes 12, 13 to the internal electrodes 17a, 17b, 18a, 18b corresponding to each other. Therefore, it is unnecessary to dispose a conductor on the surface of the piezoelectric element 10 in order to electrically connect the first electrodes 12, 13 to the internal electrodes 17a, 17b, 18a, 18b corresponding to each other. As a result, the conductors (internal electrodes 17a, 17b, 18a, 18b and pad conductors 7a, 7b, 8a, 8b) included in the piezoelectric element 10 are prevented from electrically contacting the conductor included in the device other than the vibrating device 1.

The adhesive member 30 does not include a conductive filler. Electrical connection between the first electrodes 12, 13 and the second electrodes 23, 24 is established only by physical contact between the first electrodes 12, 13 and the second electrodes 23, 24. The adhesive member 30 does not contribute to electrical connection between the first electrodes 12, 13 and the second electrodes 23, 24. The adhesive member 30 includes more resin components in a same volume and has higher adhesive strength, as compared with an adhesive member including a conductive filler. Therefore, the joining strength between the vibrating body 20 and the piezoelectric element 10 is enhanced.

Figure 7:
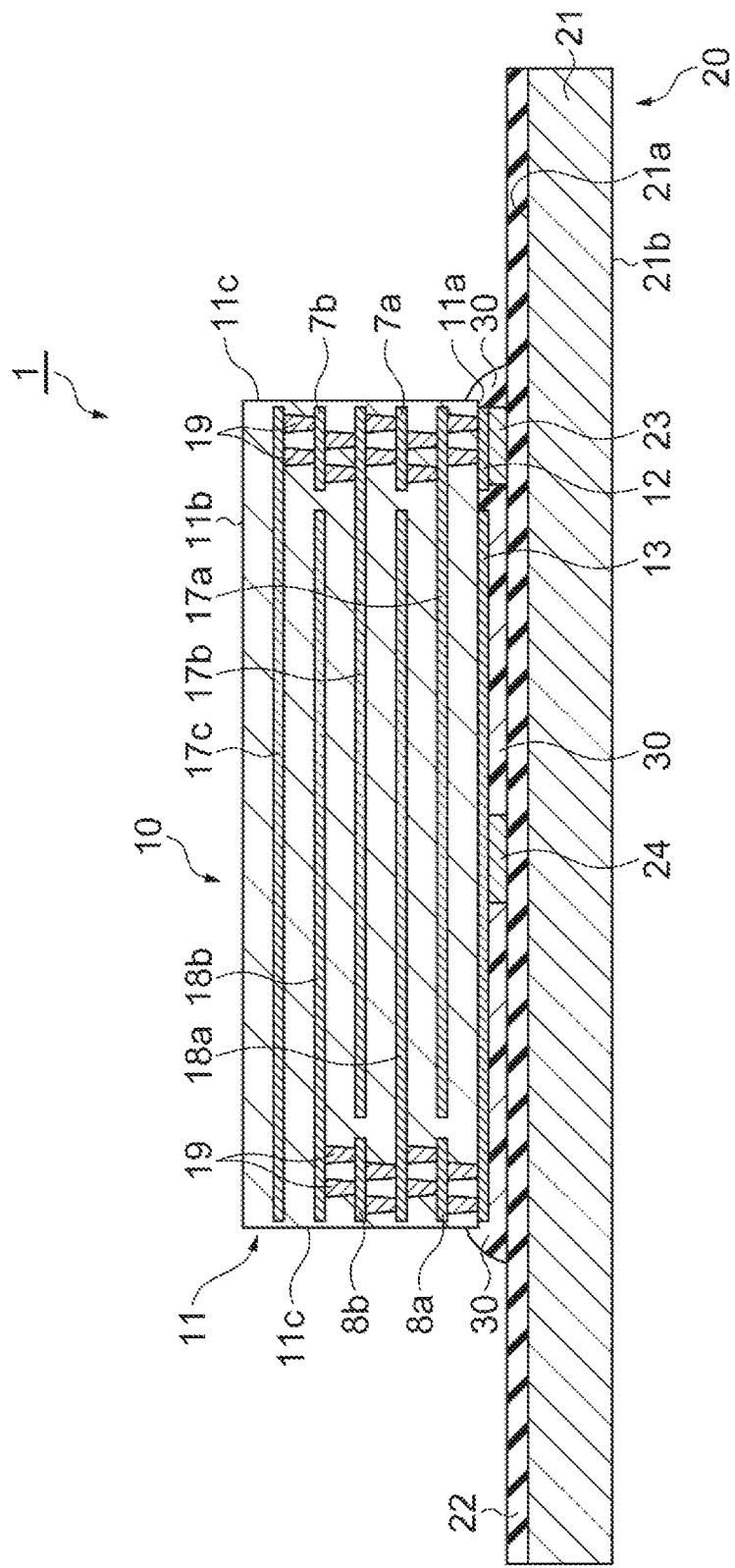
FIG. 7 is a diagram illustrating a cross-sectional configuration of a vibrating device according to a modification of the present embodiment.
Figure 8:
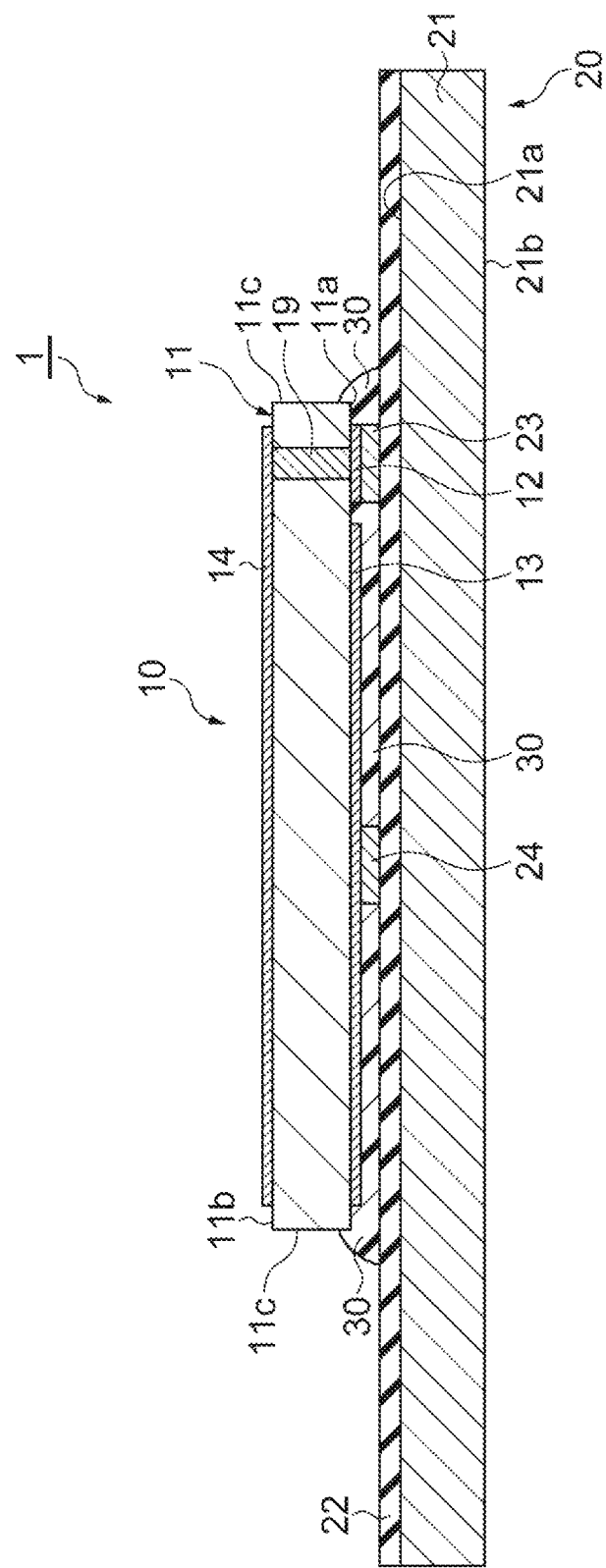
FIG. 8 is a diagram illustrating a cross-sectional configuration of a vibrating device according to a modification of the present embodiment.
Figure 9:
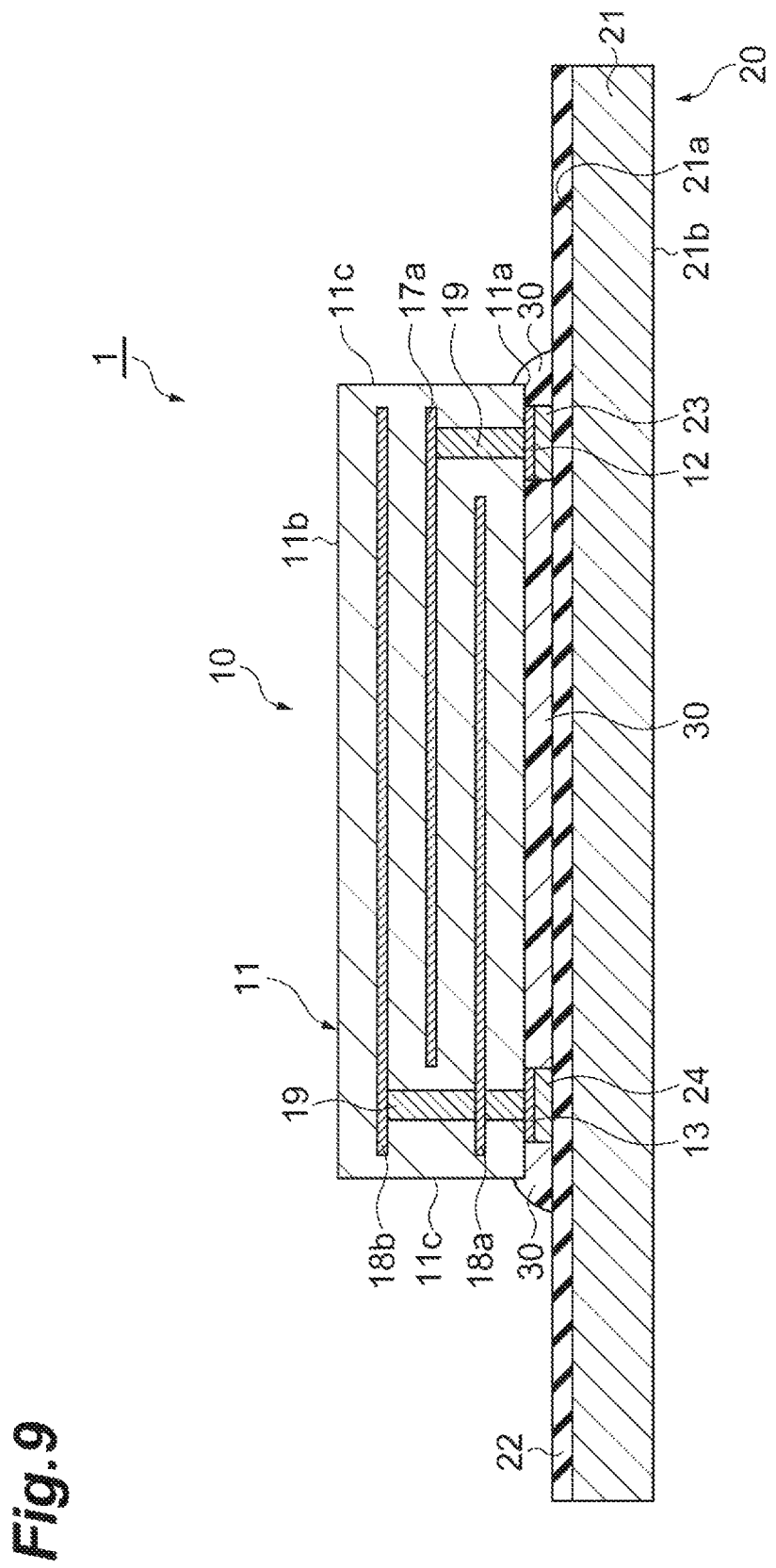
FIG. 9 is a diagram illustrating a cross-sectional configuration of a vibrating device according to a modification of the present embodiment.

Next, configurations of the vibrating device 1 according to modifications of the present embodiment will be described with reference to FIGS. 7 to 9. FIGS. 7 to 9 are diagrams illustrating cross-sectional configurations according to the modifications of the vibrating device 1.

First, the configuration of the modification illustrated in FIG. 7 will be described. A piezoelectric element 10 according to the present modification does not include a third electrode 14 included in the piezoelectric element 10 illustrated in FIG. 5. The piezoelectric element 10 according to the present modification includes, as conductors, a plurality of internal electrodes 17a, 17b, 17c, 18a, 18b, a plurality of pad conductors 7a, 7b, 8a, 8b, a pair of first electrodes 12, 13 and a via conductor 19. In the present modification, not only side surfaces 11c but also an entire second principal surface 11b are exposed. The electrodes (conductors) are not exposed on a surface other than a first principal surface 11a opposing the vibrating body 20 (third principal surface 21a). Therefore, the conductors (internal electrodes 17a, 17b, 17c, 18a, 18b and pad conductors 7a, 7b, 8a, 8b) included in the piezoelectric element 10 are prevented from contacting a conductor included in a device other than the vibrating device 1.

Next, the configuration of the modification illustrated in FIG. 8 will be described. A piezoelectric element 10 according to the present modification does not include any internal electrode. The piezoelectric element 10 according to the present modification includes, as conductors, only a pair of first electrodes 12, 13, a third electrode 14, and a via conductor 19. The third electrode 14 is electrically connected to the first electrode 12 via the via conductor 19. The first electrode 13 and the third electrode 14 each include a mutually overlapping region when viewed from a direction orthogonal to a first principal surface 11a.

In the present modification, when voltage having polarities different from each other is applied to, for example, the first electrode 12 and the first electrode 13 respectively, an electric field is generated between the first electrode 13 and the third electrode 14. Therefore, in a piezoelectric element body 11, a region interposed between the first electrode 13 and the third electrode 14 is piezoelectrically activated, the region interposed between the first electrode 13 and the third electrode 14 is displaced. In the present modification also, in the case where AC voltage is applied to the pair of first electrodes 12, 13, the piezoelectric element 10 repeats expansion and contraction in accordance with a frequency of the applied AC voltage.

Next, the configuration of the modification illustrated in FIG. 9 will be described. A piezoelectric element 10 according to the present modification includes, as conductors, a pair of first electrodes 12, 13, a plurality of internal electrodes 17a, 18a, 18b, and a via conductor 19 as conductors. The first electrode 12 is electrically connected to the internal electrode 17a via the via conductor 19. The first electrode 13 is electrically connected to the pair of internal electrodes 18a, 18b via the via conductor 19. The internal electrode 18b is disposed inside a piezoelectric element body 11. In the piezoelectric element body 11, an entire second principal surface 11b is exposed in addition to side surfaces 11c. Since the conductors (internal electrodes 17a, 18a, 18b) of the piezoelectric element 10 are not exposed on a surface of the vibrating device 1, the conductors (internal electrodes 17a, 18a, 18b) are prevented from contacting a conductor included in a device other than the vibrating device 1.

In the present modification, the first electrode 13 has the area smaller than that of the above-described embodiment and modifications illustrated in FIGS. 7 and 8. The first electrode 13 does not overlap with the internal electrode 17a when viewed from a direction orthogonal to a first principal surface 11a. In the piezoelectric element 10 according to the present modification, displacement occurs mainly due to an electric field generated between the internal electrodes 17a, 18a, 18b.

Figure 10:
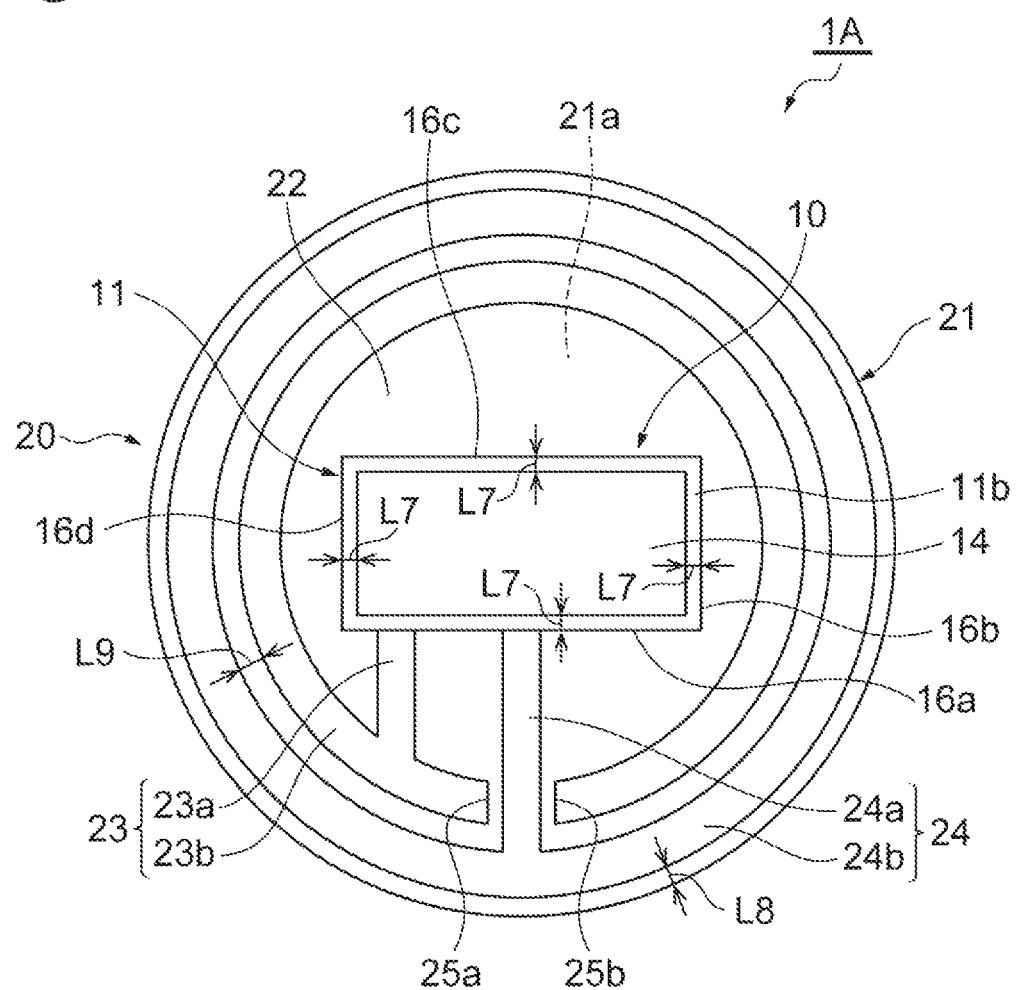
FIG. 10 is a plan view illustrating a vibrating device according to another modification of the present embodiment.

Next, a vibrating device 1A according to another modification of the present embodiment will be described with reference to FIG. 10. FIG. 10 is a plan view illustrating the vibrating device according to the present modification.

The vibrating device 1A according to the present modification includes a piezoelectric element 10, a vibrating body 20, and an adhesive member (not illustrated) in a manner similar to the above-described vibrating device 1. The adhesive member joins the piezoelectric element 10 and the vibrating body 20. As illustrated in FIG. 10, in the vibrating device 1A, the piezoelectric element 10, a metal plate 21, an insulating layer 22, and second electrodes 23, 24 have shapes different from those of the above-described vibrating device 1.

The piezoelectric element 10 according to the present modification has a rectangular shape when viewed from a direction orthogonal to a second principal surface 11b. For example, a long-side direction of a piezoelectric element body 11 has a length of 20 mm, and a short-side direction of the piezoelectric element body 11 has a length of 10 mm. A separation distance L7 between an edge of a third electrode 14 and each of edges 16a, 16b, 16c, 16d is, for example, 20 pun or more.

The metal plate 21 has a circular shape when viewed from the direction orthogonal to the second principal surface 11b. The metal plate 21 has a diameter of, for example, 30 mm. The piezoelectric element 10 is disposed at a center of the metal plate 21 via the insulating layer 22 when viewed from the direction orthogonal to the second principal surface 11b.

The second electrode 24 includes an electrode portion 24a and an electrode portion 24b. The electrode portion 24a linearly extends from a center portion of the vibrating body 20 to an edge of the vibrating body 20 (insulating layer 22). The electrode portion 24b extends annularly along an edge of the vibrating body 20. The electrode portion 24b has an annular shape. The electrode portion 24a is located inside the electrode portion 24b when viewed from a direction orthogonal to the vibrating body 20. The electrode portion 24a has one end electrically connected to the piezoelectric element 10 and the other end connected to the electrode portion 24b. The electrode portion 24b is located separately from the edge of the vibrating body 20. A separation distance L8 between an outer circumference of the electrode portion 24b and the edge of the vibrating body 20 is, for example, 5 μm or more.

The second electrode 23 includes an electrode portion 23a and an electrode portion 23b. The electrode portion 23a linearly extends from the center portion of the vibrating body 20 to the edge of the vibrating body 20 (insulating layer 22). The electrode portion 23a extends in parallel to the electrode portion 24a. The electrode portion 23a is located inside the electrode portion 23b when viewed from a direction orthogonal to the vibrating body 20. The electrode portion 23b is located inside the electrode portion 24b when viewed from the direction orthogonal to the vibrating body 20. The electrode portion 23b extends annularly along the electrode portion 24b. The electrode portion 23a has one end electrically connected to the piezoelectric element 10 and the other end connected to the inner circumference of the electrode portion 23b. The second electrode 23 and the second electrode 24 are separated from each other. A separation distance L9 between the electrode portion 23b and the electrode portion 24b is, for example, 500 μm or more.

The electrode portion 23b has a substantially annular shape. The electrode portion 23b has a pair of end portions 25a, 25b, and has an annular shape partly broken. The electrode portion 24a is disposed between the pair of end portions 25a, 25b. The pair of end portions 25a, 25b opposes each other interposing the electrode portion 24a. The electrode portion 24a extends in a manner passing between the end portion 25a and the end portion 25b. The electrode portion 23b is separated from the piezoelectric element 10 when viewed from the direction orthogonal to the vibrating body 20.

Figure 11:
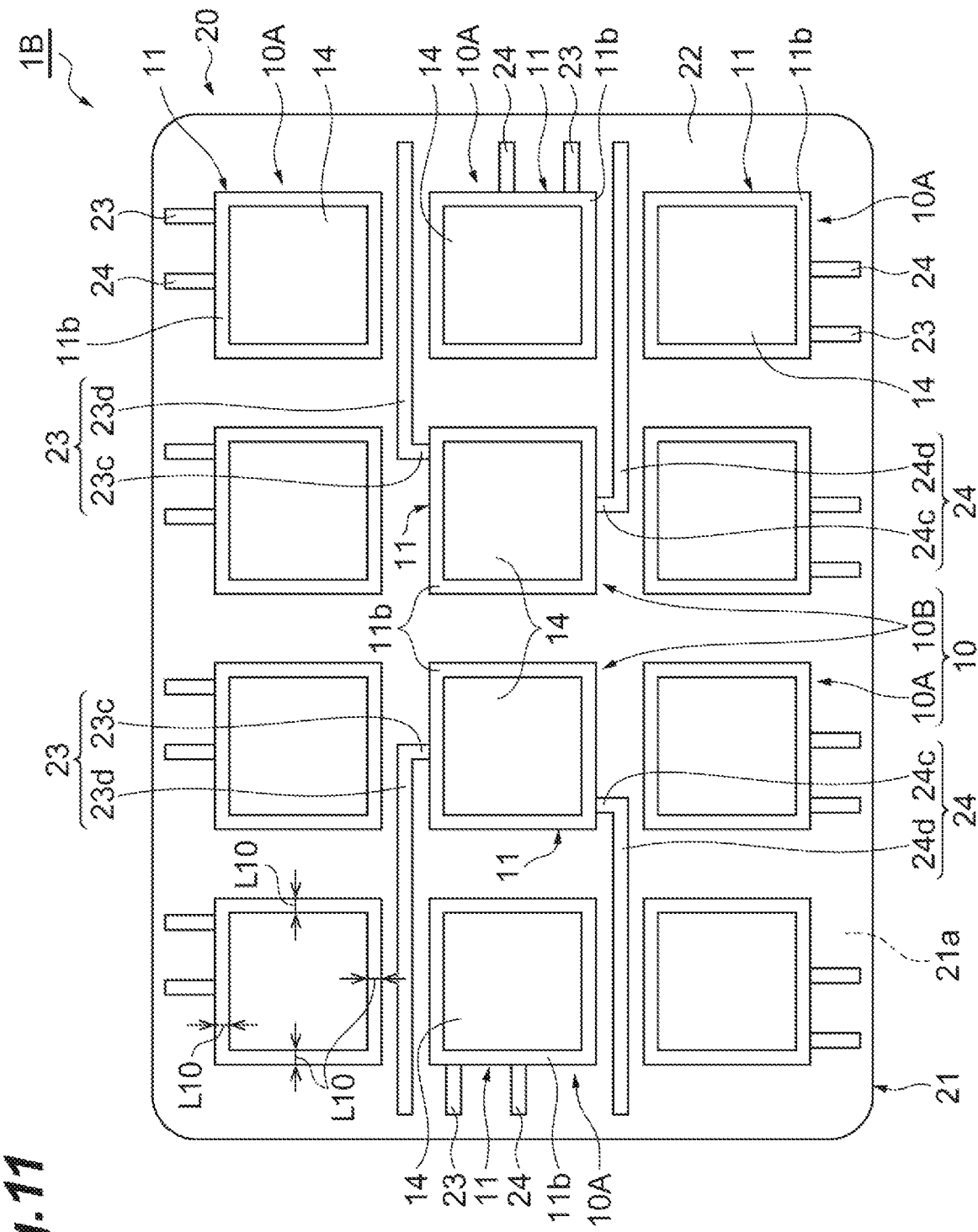
FIG. 11 is a plan view illustrating a vibrating device according to still another modification of the present embodiment.

Next, a vibrating device 1B according to a still another modification of the present embodiment will be described with reference to FIG. 11. FIG. 11 is a plan view illustrating the vibrating device according to the present modification.

As illustrated in FIG. 11, the vibrating device 1B according to the present modification includes a plurality of piezoelectric elements 10, a vibrating body 20, and an adhesive member (not illustrated). The adhesive member joins each of the piezoelectric elements 10 and the vibrating body 20. The number of the piezoelectric elements 10 disposed on the vibrating body 20 is different between the vibrating device 1B and the above-described vibrating device 1.

In the piezoelectric element 10 illustrated in FIG. 11, for example, a piezoelectric element body 11 has a length in the second direction D2 of 30 mm, and the piezoelectric element body 11 has a length in the third direction D3 of 30 mm. A separation distance L0 between an edge of a third electrode 14 and each of edges of the piezoelectric element body 11 is, for example, 20 μm or more.

A metal plate 21 has a rectangular shape when viewed from a direction orthogonal to a second principal surface 11b. The rectangular shape includes, for example, a shape in which corners are rounded. A third principal surface 21a of the metal plate 21 has a dimension of, for example, 1600 mm×1200 mm.

In the present embodiment, twelve piezoelectric elements 10 are disposed in a matrix on one vibrating body 20. The twelve piezoelectric elements 10 include ten piezoelectric elements 10A and two piezoelectric elements 10B. The ten piezoelectric elements 10A are disposed along edges of the vibrating body 20. The two piezoelectric elements 10B are disposed in a center region of the vibrating body 20. The two piezoelectric elements 10B are surrounded by the ten piezoelectric elements 10A when viewed from the direction orthogonal to the vibrating body 20.

As illustrated in FIG. 11, a pair of second electrodes 23, 24 is disposed in each of the piezoelectric elements 10 (10A, 10B). The respective second electrodes 23, 24 extend toward the edges of the vibrating body 20. End of the second electrode 23, 24 includes one end electrically connected to the corresponding piezoelectric element 10. Each of the second electrodes 23, 24 includes the other end located adjacent to the edge of the vibrating body 20 and separated from the edge of the vibrating body 20.

The second electrodes 23, 24 electrically connected to each of the piezoelectric elements 10A linearly extend. The second electrodes 23, 24 electrically connected to each of the piezoelectric elements 10B each have an L shape. Each of the L-shaped second electrodes 23 has an electrode portion 23c and an electrode portion 23d. Each of the L-shaped second electrodes 24 has an electrode portion 24c and an electrode portion 24d. Each of the electrode portions 23c, 24c extends in a short-side direction toward a corresponding long-side. Each of the electrode portions 23d, 24d extends in a long-side direction toward a corresponding short-side.

Each of the electrode portions 23c, 24c includes one end electrically connected to the piezoelectric element 10B and the other end connected to the electrode portions 23d, 24d. Each of the electrode portions 23d, 24d includes one end connected to the electrode portions 23c, 24c and the other end located in the vicinity of the edge of the vibrating body 20.

In the vibrating device 1B, the second electrodes 23, 24 are disposed in such a manner that the respective other ends are aligned at a predetermined interval along four edges of the vibrating body 20. The predetermined interval is set to a value that can prevent the adjacent second electrodes 23, 24 from short-circuiting, for example. The second electrodes 23, 24 extend toward an edge out of the four edges of the vibrating body 20 corresponding to a position of each of the piezoelectric elements 10 (10A, 10B). For example, each of the second electrodes 23, 24 connected to each of the piezoelectric elements 10A extends toward the edge closest to the corresponding piezoelectric element 10A. All of the second electrodes 23, 24 may be disposed in such a manner that each of the other ends is located along one edge of the vibrating body 20. All of the second electrodes 23, 24 may also extend toward one edge of the vibrating body 20.

The second electrode 23 and the second electrode 24 may extend toward different edges of the vibrating body 20. In which case, the second electrode 23 and the second electrode 24 may also extend toward edges opposing each other of the vibrating body 20. The second electrodes 23 of all of the piezoelectric elements 10 may extend toward one edge of the vibrating body 20. The second electrodes 24 of all of the piezoelectric elements 10 may extend toward another edge different from the edge located in the direction in which the second electrodes 23 extend.

While various embodiments and modifications of the present invention have been described hereinabove, the present invention is not limited to the above-described embodiments and modifications, but may include modifications and other applications obtained within the spirit and scope described in attached claims.

The number of the internal electrodes 17a, 17b, 17c, 18a, 18b disposed inside the piezoelectric element 10 is not limited to the number described in the above-described embodiment and modifications.

In the present embodiment, the internal electrodes 17a, 17b, 17c, 18a, 18b, first electrodes 12, 13, and third electrode 14 adapted to generate electric fields each have a rectangular shape, but not limited thereto. For example, the internal electrodes 17a, 17b, 17c, 18a, 18b, first electrodes 12, 13, and third electrode 14 each may have, for example, a circular shape when viewed from the direction orthogonal to the first principal surface 11a.

The insulating layer 22 is not constantly needed to cover the entire third principal surface 21a of the metal plate 21. As far as the second electrodes 23, 24 and the metal plate 21 are electrically insulated, the insulating layer 22 may not necessarily cover the entire third principal surface 21a. In other words, a part of the third principal surface 21a of the metal plate 21 may be exposed from the insulating layer 22. In which case also, the pair of second electrodes 23, 24 is separated from all of the edges of the insulating layer 22.

The second electrodes 23, 24 of the vibrating body 20 may include projections instead of the projections A included in the first electrodes 12, 13 of the piezoelectric element 10.

The adhesive member 30 may include a conductive filler. In which case, the first electrode 12 and the second electrode 23 are more surely electrically connected, and the first electrode 13 and the second electrode 24 are more surely electrically connected. In the present embodiment, the insulating layer 22 and the first principal surface 11a are joined by the adhesive member 30, and part of the side surfaces 11c and the insulating layer 22 are joined by the adhesive member 30. The insulating layer 22 and the first principal surface 11a are not needed to be joined. The part of the side surfaces 11c and the insulating layer 22 are not needed to be joined.

What is claimed is:

1. A vibrating device comprising:
a piezoelectric element including a piezoelectric element body having a first principal surface and a second principal surface opposing each other, and a pair of first electrodes disposed on the first principal surface; and
a vibrating body including: a metal plate having a third principal surface and a fourth principal surface opposing each other, an insulating layer disposed on the third principal surface; and a pair of second electrodes disposed on the insulating layer, wherein
the piezoelectric element and the vibrating body are disposed in such a manner that the first principal surface and the third principal surface oppose each other via the insulating layer, and
the pair of second electrodes physically contacts the respective first electrodes, and is exposed from the piezoelectric element and separated from all of edges of the insulating layer, when viewed from a direction orthogonal to the third principal surface.

2. The vibrating device according to claim 1, further comprising an adhesive member configured to join the piezoelectric element and the vibrating body, wherein
the pair of first electrodes includes a plurality of projections physically contacting the respective second electrodes, and the adhesive member is provided between the plurality of projections and joins the first electrode and the second electrode corresponding to each other.

3. The vibrating device according to claim 1, wherein the pair of first electrodes is separated from all of edges of the first principal surface when viewed from a direction orthogonal to the first principal surface.

4. The vibrating device according to claim 1, wherein
the piezoelectric element further includes a third electrode disposed on the second principal surface, and
the third electrode is separated from all of edges of the second principal surface when viewed from a direction orthogonal to the second principal surface.

5. The vibrating device according to claim 1, wherein the piezoelectric element body further includes a side surface coupling the first principal surface to the second principal surface, and the entire second principal surface and the entire side surface are exposed.

6. The vibrating device according to claim 1, wherein the piezoelectric element includes:
a plurality of internal electrodes disposed inside the piezoelectric element body and opposing each other; and
a conductor disposed inside the piezoelectric element body and configured to electrically connect the internal electrodes to the first electrodes corresponding to each other.

* * * * *